(12) United States Patent  
Lee et al.

(10) Patent No.: US 10,818,621 B2
(45) Date of Patent: Oct. 27, 2020

(54) FAN-OUT SEMICONDUCTOR PACKAGE

(71) Applicant: SAMSUNG ELECTRONICS CO., LTD., Suwon-si (KR)

(72) Inventors: Doo Hwan Lee, Suwon-si (KR); Hyoung Joon Kim, Suwon-si (KR); Dae Jung Byun, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/381,635

(22) Filed: Dec. 16, 2016

(65) Prior Publication Data
US 2017/0278812 A1 Sep. 28, 2017

(30) Foreign Application Priority Data

Mar. 25, 2016 (KR) .................. 10-2016-0036222
Jun. 21, 2016 (KR) .................. 10-2016-0077159
Aug. 24, 2016 (KR) .................. 10-2016-0107695

(51) Int. Cl.
H01L 23/00 (2006.01)
H01L 23/31 (2006.01)

(52) U.S. Cl.
CPC .......... H01L 24/05 (2013.01); H01L 23/3114 (2013.01); H01L 23/3135 (2013.01);
(Continued)

(58) Field of Classification Search
CPC .......... H01L 2224/02379; H01L 24/19; H01L 23/3128; H01L 23/5389
See application file for complete search history.

(56) References Cited

U.S. PATENT DOCUMENTS 6,362,436 B1    3/2002  Kimbara et al.
6,387,734 B1 *  5/2002  Inaba .................. H01L 23/3114
                                                                  257/701
(Continued)

FOREIGN PATENT DOCUMENTS

GB      2482894 A      2/2012
JP   2006-287048 A    10/2006
(Continued)

OTHER PUBLICATIONS

Office Action for Taiwanese Patent Application No. 105142116 dated Jan. 11, 2018, with English translation.
(Continued)

Primary Examiner — Nicholas J Tobergte
(74) Attorney, Agent, or Firm — Sughrue Mion, PLLC

(57) ABSTRACT

A fan-out semiconductor package includes: a first interconnection member having a through-hole; a semiconductor chip disposed in the through-hole and having an active surface and an inactive surface; an encapsulant encapsulating at least portions of the first interconnection member and the inactive surface of the semiconductor chip; a second interconnection member disposed on the first interconnection member and the active surface of the semiconductor chip and including a redistribution layer electrically connected to the connection pads of the semiconductor chip; a passivation layer disposed on the second interconnection member; and an under-bump metal layer including an external connection pad formed on the passivation layer and a plurality of vias connecting the external connection pad and the redistribution layer of the second interconnection member to each other, wherein the first interconnection member includes a redistribution layer electrically connected to the connection pads of the semiconductor chip.

7 Claims, 13 Drawing Sheets

(52) U.S. Cl.
CPC .............. *H01L 24/13* (2013.01); *H01L 24/19* (2013.01); *H01L 24/20* (2013.01); *H01L 23/3128* (2013.01); *H01L 2224/0235* (2013.01); *H01L 2224/02331* (2013.01); *H01L 2224/02379* (2013.01); *H01L 2224/02381* (2013.01); *H01L 2224/0401* (2013.01); *H01L 2224/04105* (2013.01); *H01L 2224/05024* (2013.01); *H01L 2224/05096* (2013.01); *H01L 2224/05569* (2013.01); *H01L 2224/12105* (2013.01); *H01L 2224/13006* (2013.01); *H01L 2224/13008* (2013.01); *H01L 2224/211* (2013.01); *H01L 2224/221* (2013.01); *H01L 2924/1431* (2013.01); *H01L 2924/1433* (2013.01); *H01L 2924/1436* (2013.01); *H01L 2924/18162* (2013.01); *H01L 2924/3511* (2013.01)

(56) References Cited

U.S. PATENT DOCUMENTS

| | | | |
|---|---|---|---|
| 6,404,052 B1* | 6/2002 | Kurita | H01L 23/49822 257/735 |
| 6,541,303 B2* | 4/2003 | Akram | H01L 23/291 257/E21.511 |
| 9,087,795 B2* | 7/2015 | Stacey | H01L 23/3114 |
| 2004/0041270 A1 | 3/2004 | Shimizu et al. | |
| 2007/0001301 A1* | 1/2007 | Wang | H01L 24/05 257/734 |
| 2009/0085192 A1 | 4/2009 | Hsu et al. | |
| 2009/0243065 A1* | 10/2009 | Sugino | H01L 23/16 257/686 |
| 2010/0144101 A1* | 6/2010 | Chow | H01L 21/561 438/127 |
| 2010/0200975 A1 | 8/2010 | Chino | |
| 2011/0240354 A1 | 10/2011 | Furuhata et al. | |
| 2012/0013021 A1 | 1/2012 | Kobayashi et al. | |
| 2012/0056329 A1 | 3/2012 | Pagaila et al. | |
| 2012/0300425 A1* | 11/2012 | Nakashima | H01L 23/49838 361/761 |
| 2013/0228897 A1* | 9/2013 | Chen | H01L 24/05 257/621 |
| 2014/0103527 A1* | 4/2014 | Marimuthu | H01L 21/6835 257/737 |
| 2014/0159251 A1 | 6/2014 | Marimuthu et al. | |
| 2014/0252573 A1 | 9/2014 | Lin et al. | |
| 2015/0048515 A1* | 2/2015 | Zhang | H01L 23/5381 257/774 |
| 2015/0115465 A1 | 4/2015 | Lin et al. | |
| 2015/0187742 A1 | 7/2015 | Kwon et al. | |
| 2016/0043047 A1 | 2/2016 | Shim et al. | |
| 2016/0322332 A1* | 11/2016 | Kim | H01L 23/16 |

FOREIGN PATENT DOCUMENTS

| | | |
|---|---|---|
| JP | 2010-186847 A | 8/2010 |
| JP | 2011-216740 A | 10/2011 |
| JP | 2012-039090 A | 2/2012 |
| JP | 2014-086481 A | 5/2014 |
| KR | 10-2013-0132163 A | 12/2013 |
| KR | 10-2015-0020107 A | 2/2015 |
| TW | 200414839 A | 8/2004 |
| TW | 201423851 A | 6/2014 |
| TW | 201436074 A | 9/2014 |
| TW | 201517218 A | 5/2015 |
| WO | 00/77843 A1 | 12/2000 |
| WO | 2011/058879 A1 | 5/2011 |

OTHER PUBLICATIONS

Japanese Office Action issued in corresponding Japanese Patent Application No. 2016-251102, dated May 8, 2018, with English Translation.
Korean Office Action dated Nov. 20, 2018 issued in Korean Patent Application No. 10-2016-0107695 (with English translation).
Office Action issued in Japanese Application No. 2016-251102 issued Nov. 6, 2018, with English translation.

* cited by examiner

FAN-OUT SEMICONDUCTOR PACKAGE

CROSS-REFERENCE TO RELATED APPLICATION(S)

This application claims the benefit of priority to Korean Patent Application Nos. 10-2016-0036222, filed on Mar. 25, 2016; 10-2016-0077159, filed on Jun. 21, 2016; and 10-2016-0107695, filed on Aug. 24, 2016 in the Korean Intellectual Property Office, the entire disclosures of which are incorporated herein by reference.

TECHNICAL FIELD

The present disclosure relates to a semiconductor package, and more particularly, to a fan-out semiconductor package in which connection terminals may be extended outwardly of a region in which a semiconductor chip is disposed.

BACKGROUND

A significant recent trend in the development of technology related to semiconductor chips has been to reduce the size of the semiconductor chips. Therefore, in the field of package technology, in accordance with a rapid increase in demand for small-sized semiconductor chips, or the like, there has been increased demand for a semiconductor package having a compact size while including a plurality of pins.

One type of package technology that may satisfy the technical demand as described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure provides a fan-out semiconductor package capable of having improved reliability against stress transferred through a connection terminal.

According to an aspect of the present disclosure, a fan-out semiconductor package having improved stress resistance includes openings formed of a plurality of vias in a passivation layer and filling the openings with an under-bump metal layer.

According to an aspect of the present disclosure, a fan-out semiconductor package includes: a first interconnection member having a through-hole; a semiconductor chip disposed in the through-hole of the first interconnection member and having an active surface having connection pads disposed thereon and an inactive surface opposing the active surface; an encapsulant encapsulating at least portions of the first interconnection member and the inactive surface of the semiconductor chip; a second interconnection member disposed on the first interconnection member and the active surface of the semiconductor chip and including a redistribution layer electrically connected to the connection pads of the semiconductor chip; a passivation layer disposed on the second interconnection member; and an under-bump metal layer including an external connection pad formed on the passivation layer and a plurality of vias connecting the external connection pad and the redistribution layer of the second interconnection member to each other, wherein the first interconnection member includes a redistribution layer electrically connected to the connection pads of the semiconductor chip.

According to another aspect of the present disclosure, a fan-out semiconductor package includes: a first interconnection member having a through-hole; a semiconductor chip disposed in the through-hole of the first interconnection member and having an active surface having connection pads disposed thereon and an inactive surface opposing the active surface; an encapsulant encapsulating at least portions of the first interconnection member and the inactive surface of the semiconductor chip; a second interconnection member disposed on the first interconnection member and the active surface of the semiconductor chip and including a redistribution layer electrically connected to the connection pads of the semiconductor chip; a passivation layer disposed on the second interconnection member; an under-bump metal layer including an external connection pad formed on the passivation layer and a plurality of vias connecting the external connection pad and the redistribution layer of the second interconnection member to each other; and connection terminals connected to the external connection pads, at least one of the connection terminals being disposed in a fan-out region, wherein the first interconnection member includes a redistribution layer electrically connected to the connection pads of the semiconductor chip.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION

Figure 1:
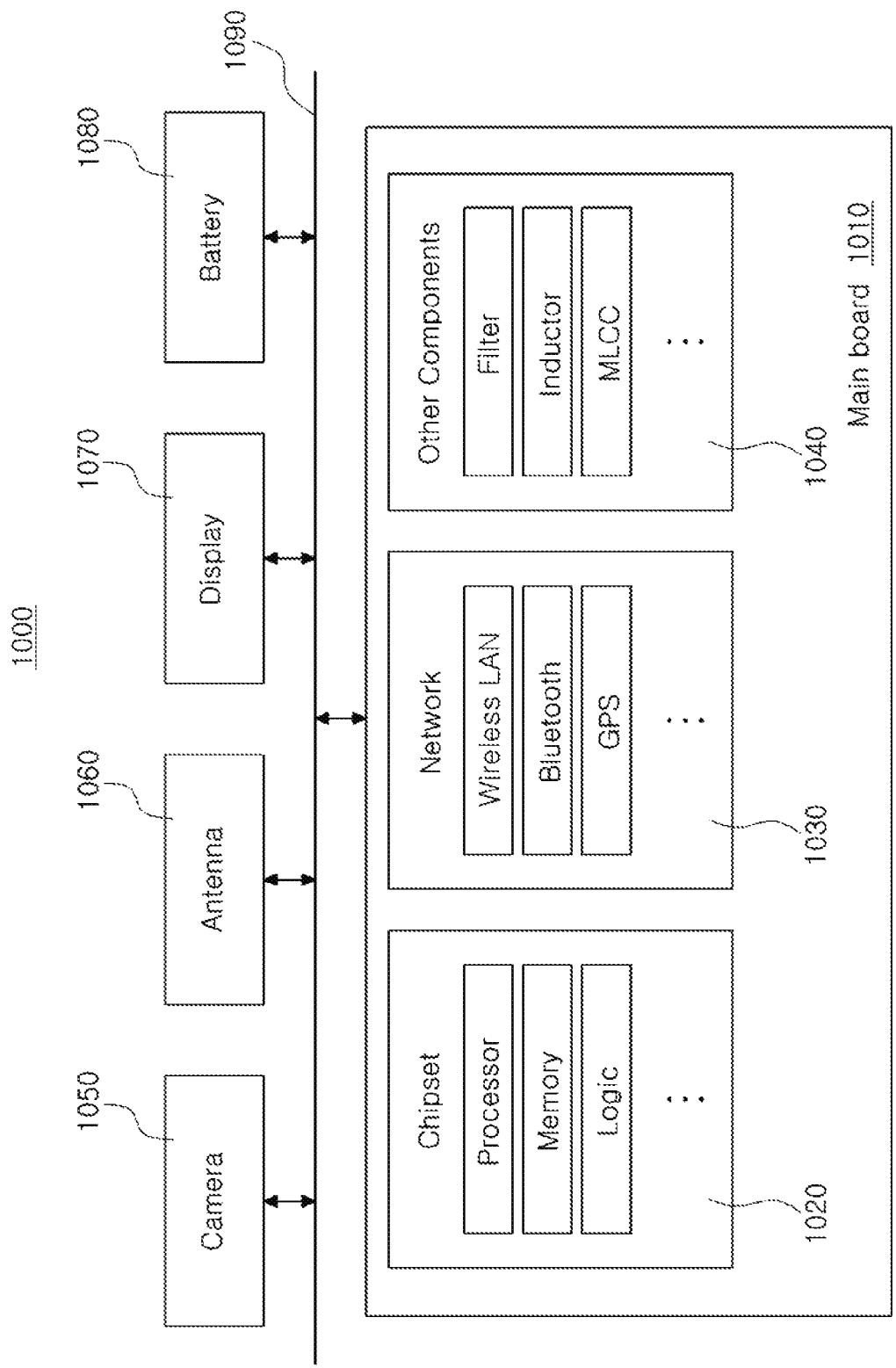
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first interconnection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a main board 1010 therein. The main board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, but may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
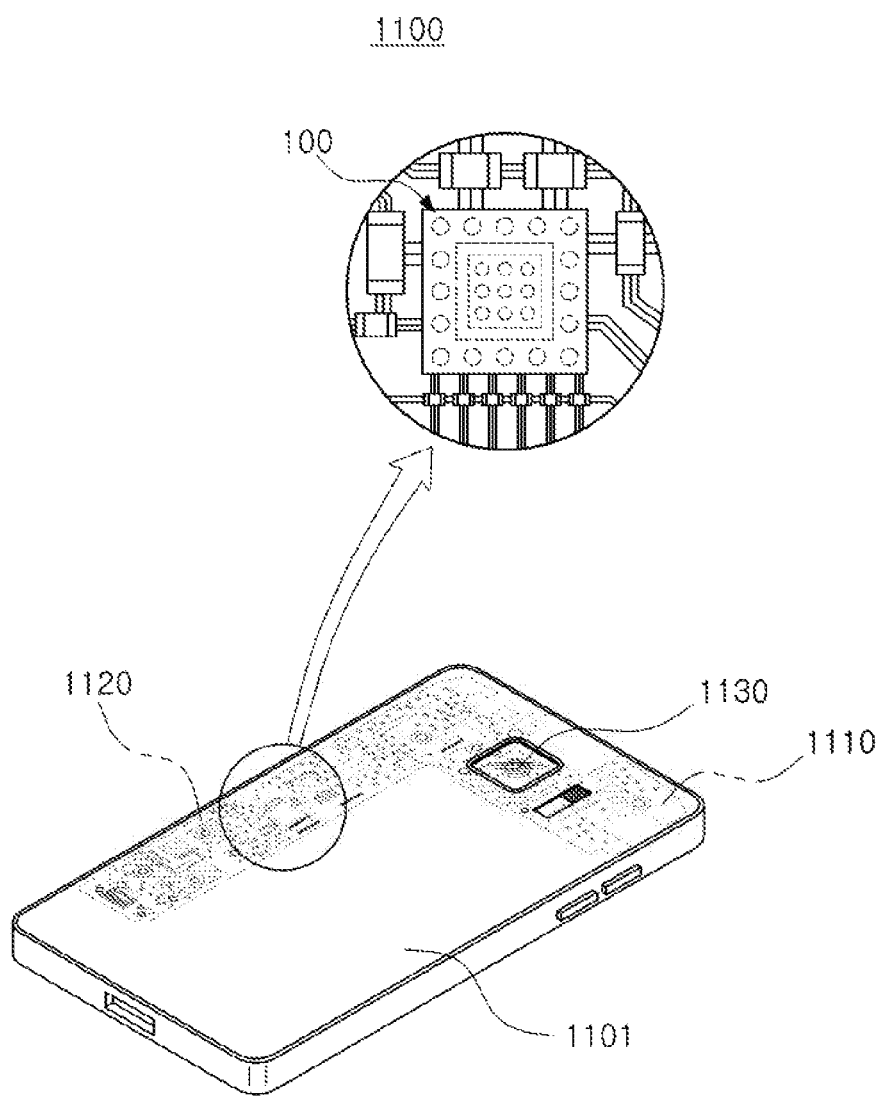
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1050, may be accommodated in the body 1101. Some of the electronic components 1120 may be the chip-related components 1020, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself to avoid damage due to external physical or chemical impacts. Therefore, the semiconductor chip itself may not be used in a bare state, but may be packaged and used in an electronic device, or the like, in a packaged state.

In addition, semiconductor packaging may be beneficial due to the existence of a difference in a circuit width between the semiconductor chip and a main board of the electronic device in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and packaging technology for buffering a difference in a circuit width between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
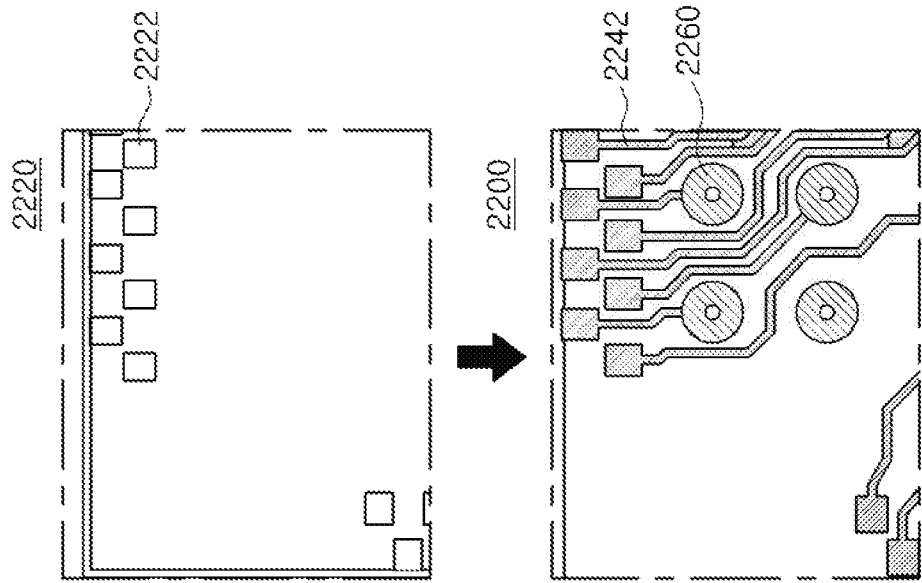
FIGS. 3A and 3B are schematic cross-sectional views illustrating states of a fan-in semiconductor package before and after being packaged.
Figure 3A:
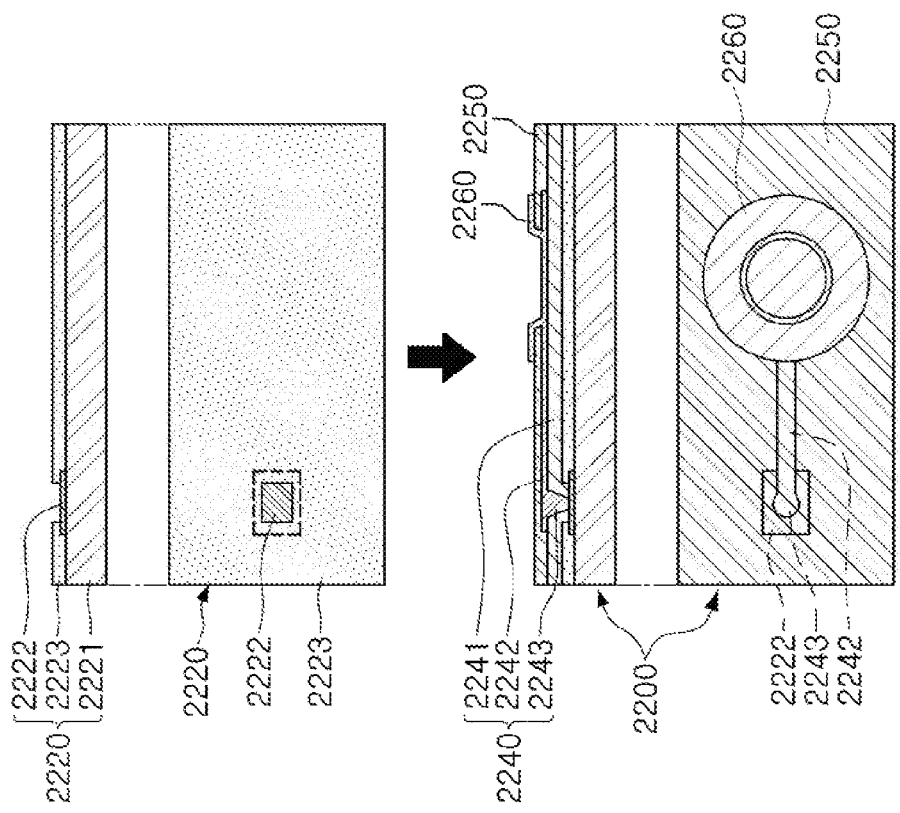

FIGS. 3A and 3B are schematic cross-sectional views illustrating states of a fan-in semiconductor package before and after being packaged.

Figure 4:
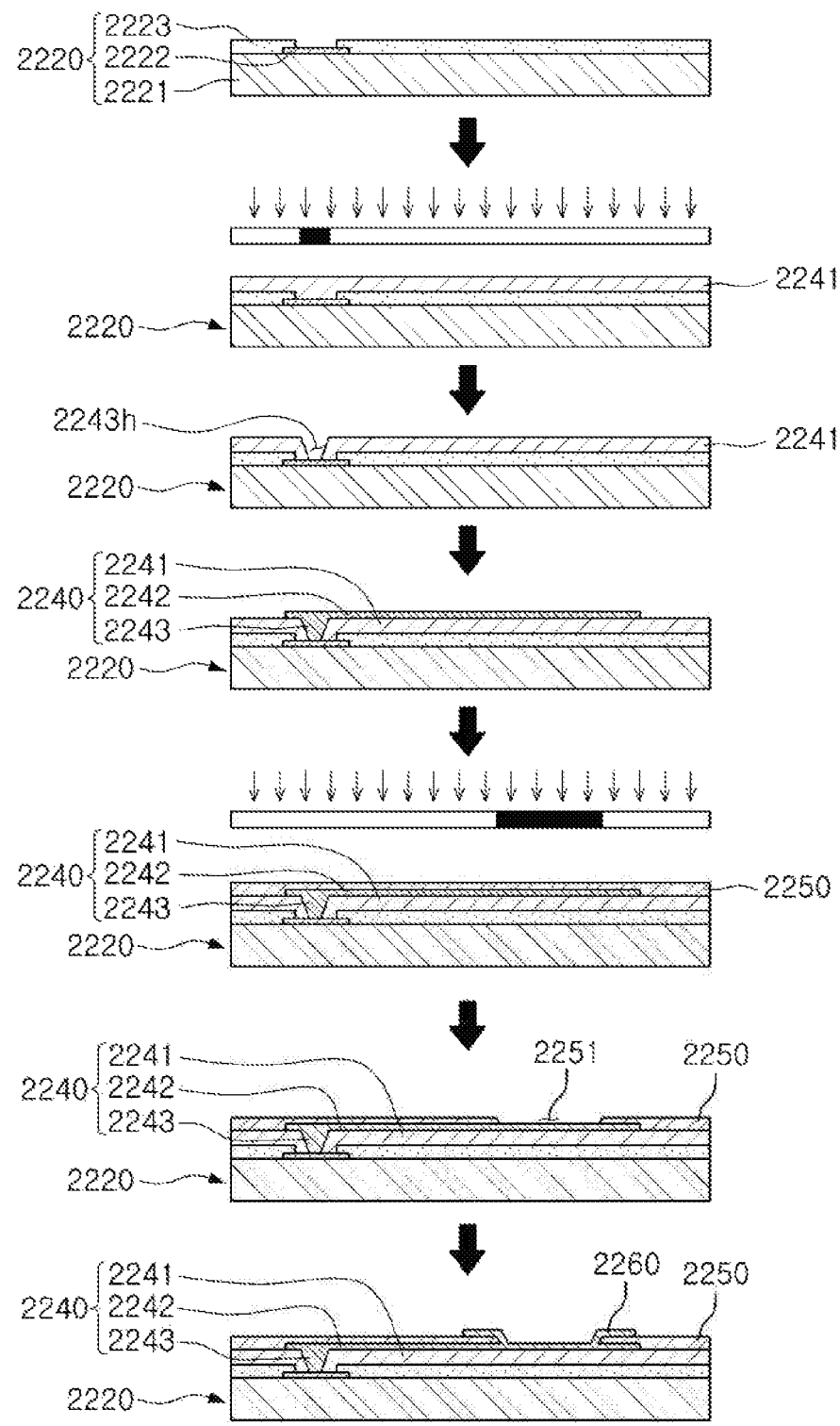
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, an interconnection member 2240 may be formed depending on a size of the semiconductor chip 2220 on the semiconductor chip 2220 in order to redistribute the connection pads 2222. The interconnection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and may be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
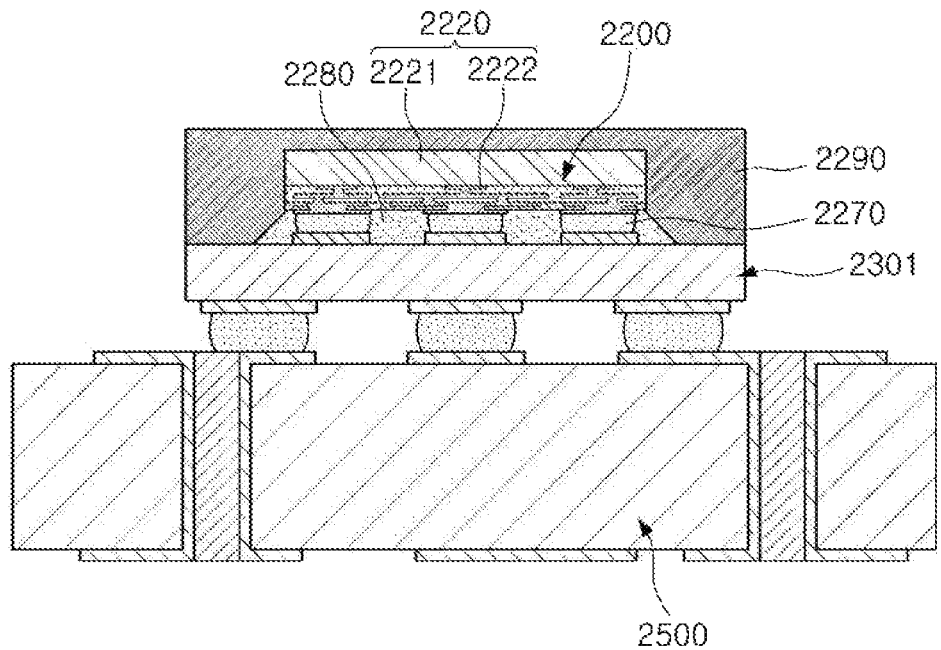
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
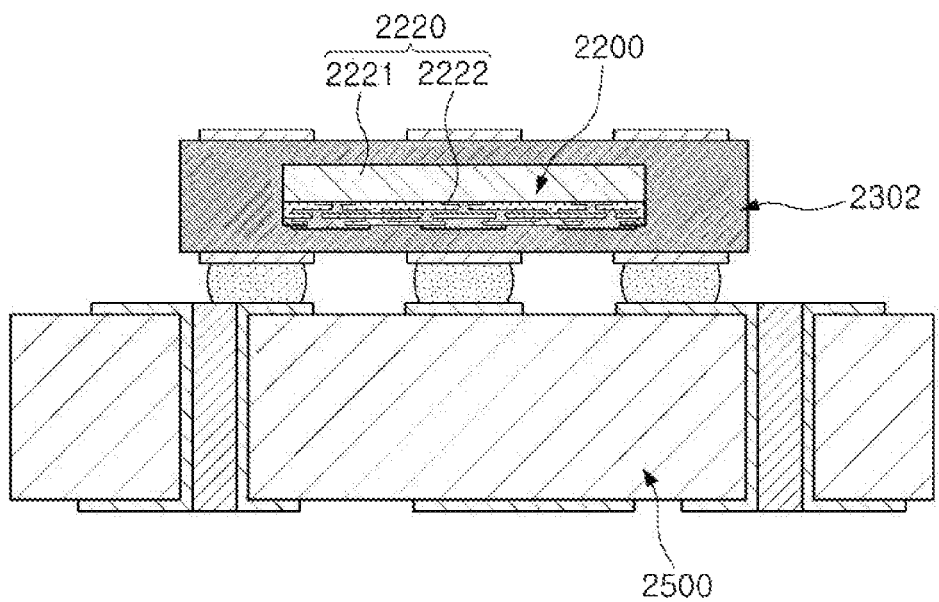
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-out Semiconductor Package

Figure 7:
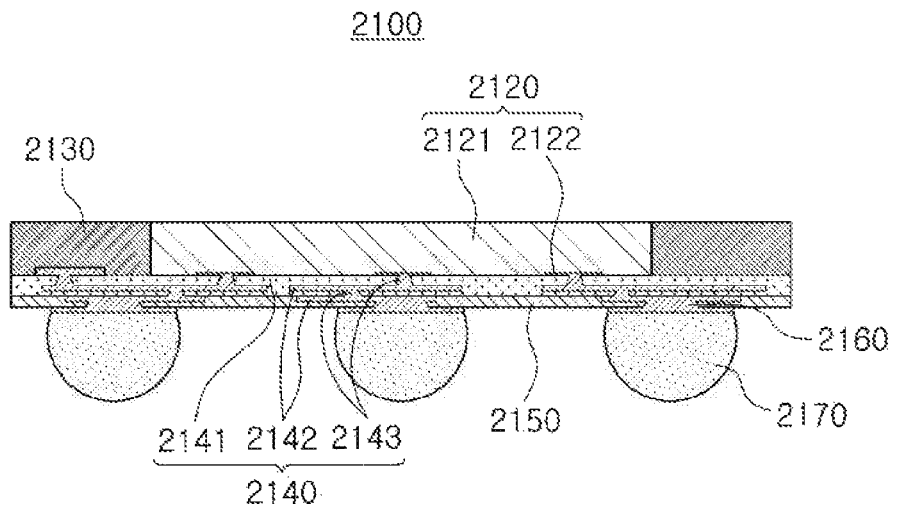
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by an interconnection member 2140. In this case, a passivation layer 2150 may be further formed on the interconnection member 2140, and an under-bump metal layer 2160 may be further formed in openings of the passivation layer 2150. Solder balls 2170 may be further formed on the under-bump metal layer 2160. The semiconductor chip 2120 may be an integrated circuit (IC) including a body 2121, the connection pads 2122, a passivation layer (not illustrated), and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
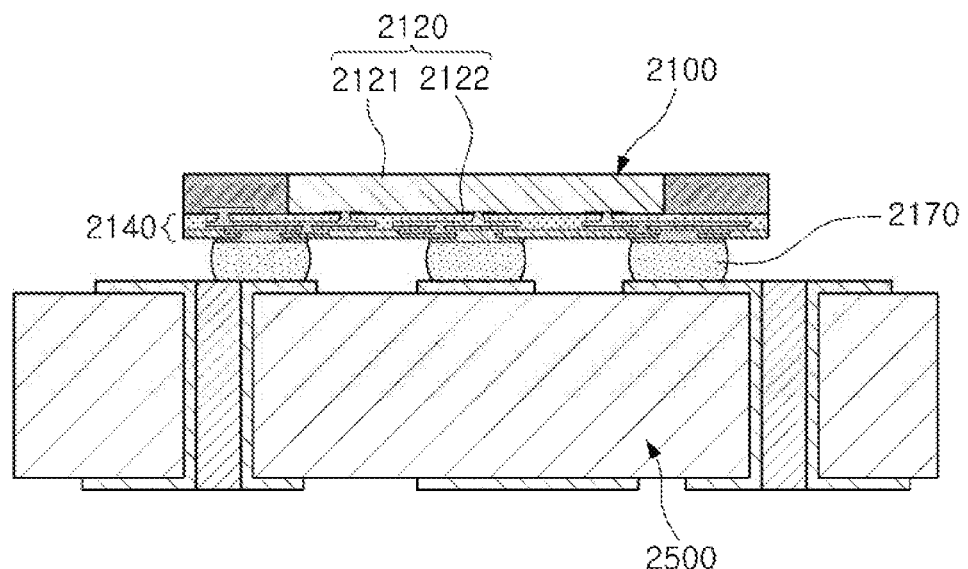
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package capable of having sufficient reliability against stress transferred through a connection terminal will hereinafter be described with reference to the drawings.

Figure 9:
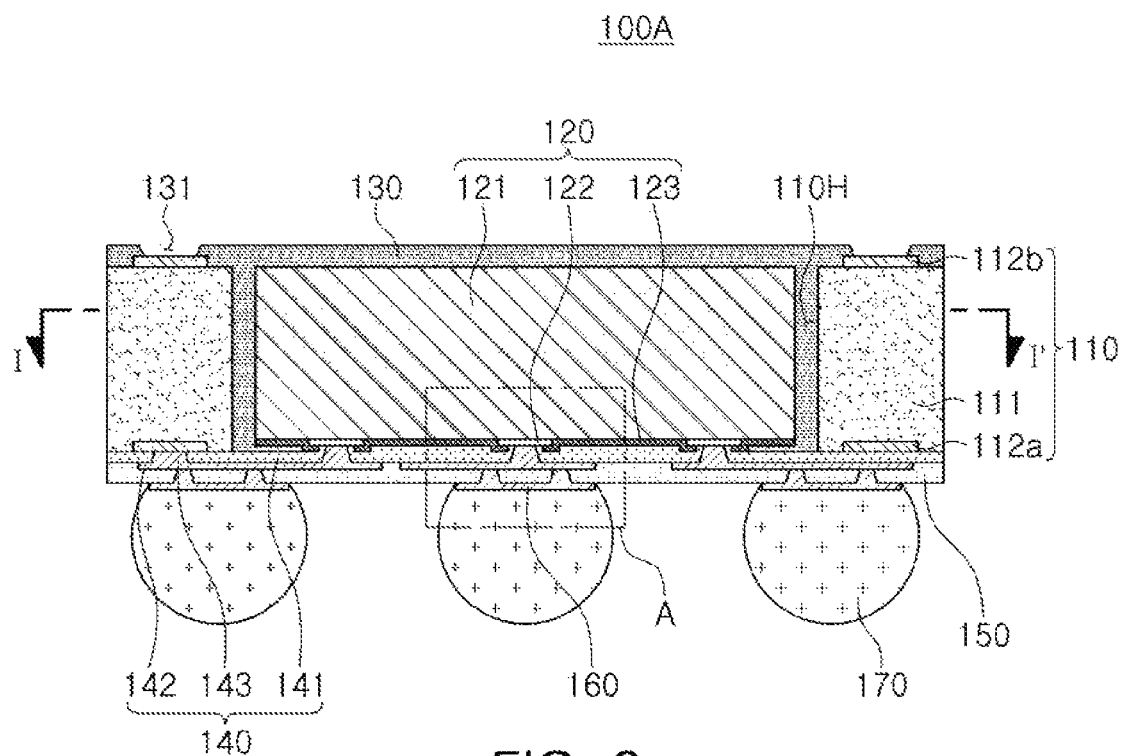
FIG. 9 is a schematic cross-sectional view illustrating an example of a fan-out semiconductor package.

FIG. 9 is a schematic cross-sectional view illustrating an example of a fan-out semiconductor package.

Figure 10:
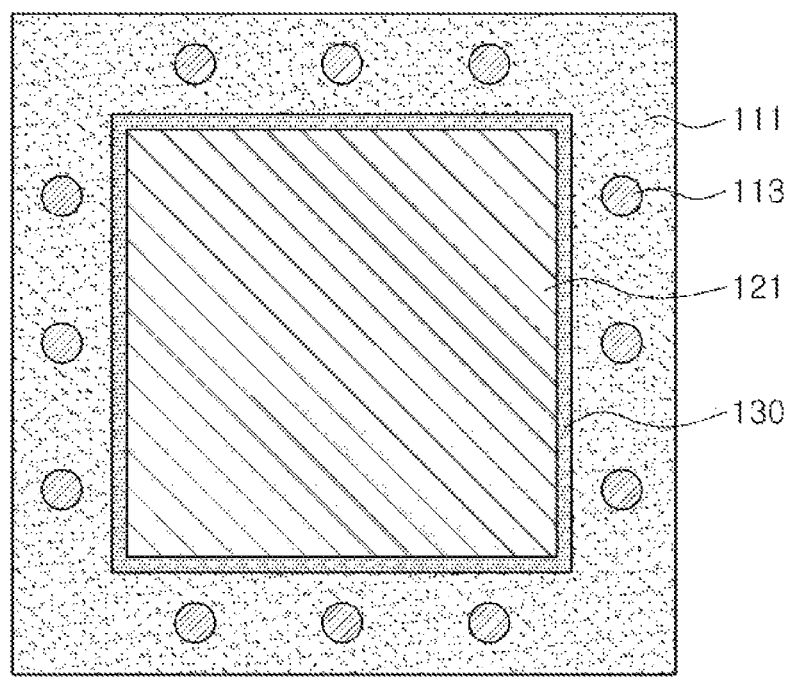
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Figure 11A:
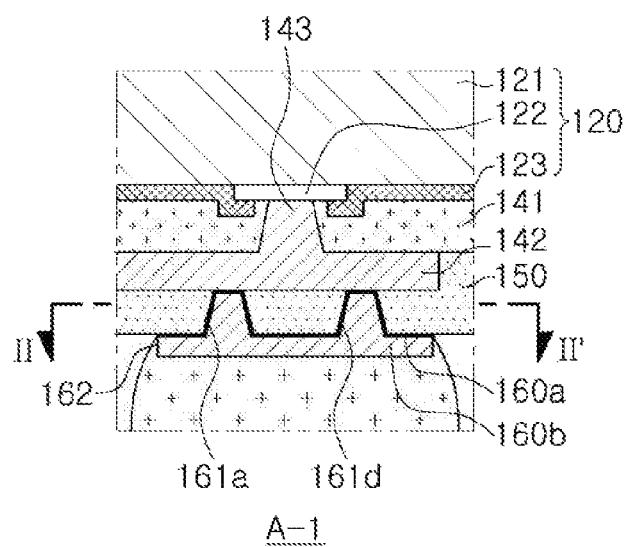
FIGS. 11A and 11B are schematic enlarged views illustrating region A of the fan-out semiconductor package of FIG. 9.
Figure 11B:
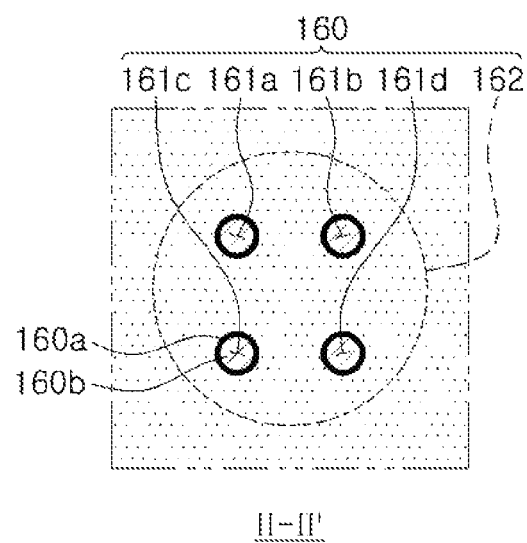

FIGS. 11A and 11B are schematic enlarged views illustrating region A of the fan-out semiconductor package of FIG. 9.

Referring to the drawings, a fan-out semiconductor package 100A according to an exemplary embodiment in the present disclosure may include a first interconnection member 110 having a through-hole 110H, a semiconductor chip 120 disposed in the through-hole 110H of the first interconnection member 110 and having an active surface having connection pads 122 disposed thereon and an inactive surface opposing the active surface, an encapsulant 130 encapsulating at least portions of the first interconnection member 110 and the inactive surface of the semiconductor chip 120, a second interconnection member 140 disposed on the first interconnection member 110 and the active surface of the semiconductor chip 120 and including a redistribution layer 142 electrically connected to the connection pads 122, a passivation layer 150 disposed on the second interconnection member 140, an under-bump metal layer 160 including external connection pads 162 formed on the passivation layer 150 and a plurality of vias 161a, 161b, 161c, and 161d connecting the external connection pads 162 and the redistribution layer 142 of the second interconnection member 140 to each other, and connection terminals 170 connected to the external connection pads 162.

Generally, a coefficient of thermal expansion (CTE) of a main board of an electronic device may be smaller than that of an insulating layer of an interconnection member of a fan-out semiconductor package. For example, the main board may have a CTE of approximately 17 to 18 ppm/° C., and the insulating layer of the interconnection member may be mainly formed of a photosensitive material to thus have a CTE of approximately 60 ppm/° C. or more. Therefore, in a case in which the fan-out semiconductor package is mounted on the main board, stress transferred through a connection terminal such as a solder ball may be applied to an inner portion of the fan-out semiconductor package as it is due to a difference between the CTEs to cause a problem of board level reliability.

On the other hand, in a case in which the under-bump metal layer 160 including the external connection pads 162 formed on the passivation layer 150 and the plurality of vias 161a, 161b, 161c, and 161d connecting the external connection pads 162 and the redistribution layer 142 of the second interconnection member 140 to each other is introduced as in the fan-out semiconductor package 100A according to the exemplary embodiment, stress may be dispersed through the plurality of vias 161a, 161b, 161c, and 161d, and a metal portion may be increased through the plurality of vias 161a, 161b, 161c, and 161d to secure sufficient stress resistance. Resultantly, the problem of the board level reliability described above may be improved.

The respective components included in the fan-out semiconductor package 100A according to the exemplary embodiment will hereinafter be described below in more detail.

The first interconnection member 110 may include the redistribution layers 112a and 112b redistributing the connection pads 122 of the semiconductor chip 120 to thus reduce the number of layers of the second interconnection member 140. The first interconnection member 110 may maintain rigidity of the fan-out semiconductor package 100A depending on certain materials, and serve to secure uniformity of a thickness of the encapsulant 130. In some cases, due to the first interconnection member 110, the fan-out semiconductor package 100A according to the exemplary embodiment may be used as a portion of a package-on-package. The first interconnection member 110 may have the through-hole 110H. The through-hole 110H may have the semiconductor chip 120 disposed therein to be spaced apart from the first interconnection member 110 by a predetermined distance. Side surfaces of the semiconductor chip 120 may be surrounded by the first interconnection member 110. However, such a form is only an example and may be variously modified to have other forms, and the fan-out semiconductor package 100A may perform another function depending on such a form.

The first interconnection member 110 may include an insulating layer 111 in contact with the second interconnection member 140, a first redistribution layer 112a in contact with the second interconnection member 140 and embedded in the insulating layer 111, and a second redistribution layer 112b disposed on the other surface of the insulating layer 111 opposing the surface of the insulating layer 111 in which the first redistribution layer 112a is embedded. The first interconnection member 110 may include vias 113 penetrating through the insulating layer 111 and electrically connecting the first and second redistribution layers 112a and 112b to each other. The first and second redistribution layers 112a and 112b may be electrically connected to the connection pads 122. When the first redistribution layer 112a is embedded in the insulating layer 111, a step portion generated due to a thickness of the first redistribution layer 112a may be significantly reduced, and an insulating distance of the second interconnection member 140 may thus become constant. That is, a difference between a distance from the redistribution layer 142 of the second interconnection member 140 to a lower surface of the insulating layer 111 and a distance from the redistribution layer 142 of the second interconnection member 140 to the connection pads 122 may be smaller than a thickness of the first redistribution layer 112a. Therefore, a high density wiring design of the second interconnection member 140 may be easy.

A material of the insulating layer 111 is not particularly limited. For example, an insulating material may be used as a material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass cloth (or a glass fabric), for example, prepreg, Ajinomoto Build up Film (ABF), FR-4, Bismaleimide Triazine (BT), or the like. Alternatively, a photoimagable dielectric (PID) resin may also be used as the insulating material.

The redistribution layers 112a and 112b may serve to redistribute the connection pads 122 of the semiconductor chip 120. A material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may perform various functions depending on designs of their corresponding layers. For example, the redistribution layers 112a and 112b may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 112a and 112b may include a via pad, a connection terminal pad, and the like. As a non-restrictive example, both of the redistribution layers 112a and 112b may include a ground pattern. In this case, the number of ground patterns formed on the redistribution layers 142 of the second interconnection member 140 may be significantly reduced, such that a degree of wiring design freedom may be improved.

Surface treatment layers (not illustrated) may be further formed on portions of the redistribution layer 112b exposed from the redistribution layers 112a and 112b through openings 131 formed in the encapsulant 130. The surface treatment layers (not illustrated) are not particularly limited as long as they are known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 113 may electrically connect the redistribution layers 112a and 112b formed on different layers to each other, resulting in an electrical path in the first interconnection member 110. Each of the vias 113 may also be formed of a conductive material. Each of the vias 113 may be completely filled with the conductive material, as illustrated in FIG. 10, or the conductive material may also be formed along a wall of each of the vias 113. In addition, each of the vias 113 may have all shapes known in the related art, such as a tapered shape, a cylindrical shape, and the like. As seen from a process to be described below, when holes for the vias 113 are formed, some of the pads of the first redistribution layer 112a may serve as a stopper, and it may be thus advantageous in a process that each of the vias 113 has the tapered shape of which a width of an upper surface is greater than that of a lower surface. In this case, the vias 113 may be integrated with portions of the second redistribution layer 112b.

The semiconductor chip 120 may be an integrated circuit (IC) provided in an amount of several hundreds to several millions of elements or more integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pads 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other positions.

The inactive surface of the semiconductor chip 120 may be disposed on a level below an upper surface of the second redistribution layer 112b of the first interconnection member 110. For example, the inactive surface of the semiconductor chip 120 may be disposed on a level below an upper surface of the insulating layer 111 of the first interconnection member 110. A height difference between the inactive surface of the semiconductor chip 120 and the upper surface of the second redistribution layer 112b of the first interconnection member 110 may be 2 μm or more, for example, 5 μm or more. In this case, generation of cracks in corners of the inactive surface of the semiconductor chip 120 may be effectively prevented. In addition, a deviation of an insulating distance on the inactive surface of the semiconductor chip 120 in a case in which the encapsulant 130 is used may be significantly reduced.

The encapsulant 130 may protect the first interconnection member 110 and/or the semiconductor chip 120. An encapsulation form of the encapsulant 130 is not particularly limited, but may be a form in which the encapsulant 130 surrounds at least portions of the first interconnection member 110 and/or the semiconductor chip 120. For example, the encapsulant 130 may cover the first interconnection member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the second interconnection member 140. Meanwhile, the encapsulant 130 may fill the through-hole 110H to thus serve as an adhesive and reduce buckling of the semiconductor chip 120 depending on certain materials.

The certain materials of the encapsulant 130 are not particularly limited. For example, an insulating material may be used as the certain materials of the encapsulant 130. In this case, the insulating material may be a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an EMC, or the like, may also be used. Alternatively, a resin in which a thermosetting resin or a thermoplastic resin is impregnated together with an inorganic filler in a core material such as a glass cloth (or a glass fabric) may also be used as the insulating material.

The encapsulant 130 may include a plurality of layers formed of a plurality of materials. For example, a space within the through-hole 110H may be filled with a first encapsulant, and the first interconnection member 110 and the semiconductor chip 120 may be covered with a second encapsulant. Alternatively, the first encapsulant may cover the first interconnection member 110 and the semiconductor chip 120 at a predetermined thickness while filling the space within the through-hole 110H, and the second encapsulant may again cover the first encapsulant at a predetermined thickness. In addition to the form described above, various forms may be used.

The encapsulant 130 may include conductive particles in order to block electromagnetic waves, if necessary. For example, the conductive particles may be any material that may block electromagnetic waves, for example, copper (Cu), aluminum (Al), silver (Ag), tin (Sn), gold (Au), nickel (Ni), lead (Pb), titanium (Ti), a solder, or the like. However, this is only an example, and the conductive particles are not particularly limited thereto.

The second interconnection member 140 may be configured to redistribute the connection pads 122 of the semiconductor chip 120. Several tens to several hundreds of connection pads 122 having various functions may be redistributed by the second interconnection member 140, and may be physically or electrically connected to an external source through connection terminals 170 to be described below depending on the functions. The second interconnection member 140 may include insulating layers 141, the redistribution layers 142 disposed on the insulating layers 141, and vias 143 penetrating through the insulating layers 141 and connecting the redistribution layers 142 to each other. In the fan-out semiconductor package 100A according to the exemplary embodiment, the second interconnection member 140 may include a single layer, but may also include a plurality of layers.

An insulating material may be used as a material of the insulating layers 141. In this case, a photosensitive insulating material such as a photoimagable dielectric (PID) resin may also be used as the insulating material. In this case, the insulating layer 141 may be formed to have a smaller thickness, and a fine pitch of the via 143 may be achieved more easily. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may substantially serve to redistribute the connection pads 122. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the redistribution layers 142 may include a via pad, a connection terminal pad, and the like.

Surface treatment layers (not illustrated) may be formed on the exposed redistribution layer 142, if necessary. The surface treatment layers (not illustrated) are not particularly limited as long as they are known in the related art, and may be formed by, for example, electrolytic gold plating, electroless gold plating, OSP or electroless tin plating, electroless silver plating, electroless nickel plating/substituted gold plating, DIG plating, HASL, or the like.

The vias 143 may electrically connect the redistribution layers 142, the connection pads 122, or the like, formed on different layers to each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. The via 143 may be completely filled with the conductive material, or the conductive material may also be formed along a wall of the via. In addition, the via 143 may have all shapes known in the related art, such as a tapered shape, a cylindrical shape, and the like.

Thicknesses of the redistribution layers 112a and 112b of the first interconnection member 110 may be greater than those of the redistribution layers 142 of the second interconnection member 140. Since the first interconnection member 110 may have a thickness equal to or greater than that of the semiconductor chip 120, the redistribution layers 112a and 112b formed in the first interconnection member 110 may be formed to have large sizes depending on a scale of the first interconnection member 110. On the other hand, the redistribution layers 142 of the second interconnection member 140 may be formed at sizes relatively smaller than those of the redistribution layers 112a and 112b of the first interconnection member 110 for thinness of the second interconnection member 140.

The passivation layer 150 may be configured to protect the second interconnection member 140 from external physical or chemical damage. The passivation layer 150 may have openings formed of a plurality of holes exposing at least portions of the redistribution layer 142 of the second interconnection member 140. The number of openings formed in the passivation layer 150 may be several tens to several thousands.

A material of the passivation layer 150 is not particularly limited, and may be a photosensitive insulating material such as a photoimagable dielectric (PID) resin. Alternatively, a solder resist may also be used as the material of the passivation layer 150. Alternatively, an insulating material that includes a filler and a resin, but does not include a glass cloth, such as ABF, or the like, may be used. A surface roughness of the passivation layer 150 may be lower as compared to a general case. When the surface roughness is low as described above, several side effects that may ensue in a circuit forming process, for example, generation of a stain on a surface, difficulty in implementing a fine circuit, and the like, may be improved.

The under-bump metal layer 160 may improve connection reliability of the connection terminals 170. The under-bump metal layer 160 may include the external connection pads 162 formed on the passivation layer 150 and the plurality of vias 161a, 161b, 161c, and 161d connecting the external connection pads 162 and the redistribution layer 142 of the second interconnection member 140 to each other. As described above, the stress may be dispersed through the plurality of vias 161a, 161b, 161c, and 161d, and the metal portion may be increased through the plurality of vias 161a, 161b, 161c, and 161d to secure sufficient stress resistance. Resultantly, the problem of the board level reliability described above may be improved. The plurality of vias 161a, 161b, 161c, and 161d may completely fill the plurality of holes constituting the opening of the passivation layer 150, or fill only portions of the holes along walls of the respective holes in some case. The external connection pad 162 may be formed on the plurality of vias 161a, 161b, 161c, and 161d, and may be extended to a surface of the passivation layer 150.

The under-bump metal layer 160 may include a first conductor layer 160a formed on the walls of the plurality of holes constituting the opening of the exposed redistribution layer 142 and the surface of the passivation layer 150, and a second conductor layer 160b formed on the first conductor layer 160a, in terms of materials. The first conductor layer 160a may serve as a seed layer, and the second conductor layer 160b may substantially serve as the under-bump metal layer 160. The first and second conductor layers 160a and 160b may include the known conductive materials, preferably, electroless copper (Cu) and electrolytic copper (Cu), respectively. The first conductor layer 160a may serve as the seed layer to thus have a very thin thickness. Therefore, the first conductor layer 160a may have a thickness lower than that of the second conductor layer 160b.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less. When the connection terminals 170 are solder balls, the connection terminals 170 may cover side surfaces of the under-bump metal layer 160 extended onto one surface of the passivation layer 150, and connection reliability may be improved.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Although not illustrated in the drawings, a metal layer may be further disposed on an inner wall of the through-hole 110H of the first interconnection member 110, if necessary. That is, the side surfaces of the semiconductor chip 120 may also be surrounded by the metal layer. Heat generated by the semiconductor chip 120 may be effectively radiated in an upward or downward direction of the fan-out semiconductor package 100A through the metal layer, and electromagnetic waves may be effectively blocked through the metal layer. In addition, a plurality of semiconductor chips may be disposed in the through-hole 110H of the first interconnection member 110, and the number of through-holes 110H of the first interconnection member 110 may be plural and semiconductor chips may be disposed in the through-holes, respectively. In addition, separate passive components such as a condenser, an inductor, and the like, may be disposed together with the semiconductor chip in the through-hole 110H. In addition, a surface mounted component may also be mounted on the passivation layer 150 to be positioned on a level that is substantially the same as that of the connection terminal 170.

A method of manufacturing the fan-out semiconductor package 100A according to the exemplary embodiment will hereinafter be described.

First, a detachable film may be prepared. Metal layers may be formed on one surface or both surfaces of the detachable film. Surface treatment may be performed on a bonded surface between the metal layers in order to facilitate separation in the subsequent separating process. Alternatively, a release layer may be provided between the metal layers to facilitate separation in the subsequent process. The detachable film may be the known insulating substrate, and a material of the detachable film may be any material. The metal layers may be generally copper (Cu) foils, but are not limited thereto. That is, the metal layers may be thin films formed of other conductive materials. Next, patterning for forming the first redistribution layer 112a may be performed using a dry film. The first redistribution layer 112a may be formed using the known photolithography method. The dry film may be a dry film formed of a photosensitive material. Next, a conductive material may fill a patterned space of the dry film to form the first redistribution layer 112a. The first redistribution layer 112a may be formed using a plating process. In this case, the metal layer may serve as a seed layer. Electroplating, electroless plating, or the like, may be used as the plating process. In detail, chemical vapor deposition (CVD), physical vapor deposition (PVD), sputtering, a subtractive process, an additive process, a semi-additive process (SAP), a modified semi-additive process (MSAP), or the like, may be used as the plating process. Next, the dry film may be removed by an etching process, or the like.

Next, the insulating layer 111 embedding at least a portion of the first redistribution layer 112a therein may be formed on the metal layer. Then, the vias 113 penetrating through the insulating layer 111 may be formed. In addition, the second redistribution layer 112b may be formed on the insulating layer 111. The insulating layer 111 may be formed by a method of laminating a precursor of the insulating layer 111 by the known lamination method and then hardening the precursor, a method of applying a precursor of the insulating layer 111 by the known application method and then hardening the precursor, or the like. The vias 113 and the second redistribution layer 112b may be formed by a method of forming holes using photolithography, mechanical drilling, laser drilling, or the like, performing patterning using a dry film, or the like, and filling the holes and the patterned space by a plating process, or the like. Next, the detachable film may be peeled off. In this case, the peel-off may refer to separation of the metal layers. Here, the metal layers may be separated using a blade, but are not limited thereto. That is, all known methods may be used to separate the metal layers. Meanwhile, an example in which the first interconnection member 110 before formation of the through-hole is formed before the detachable film is peeled off has been described in a series of processes, but is not limited thereto. For example, the first interconnection member 110 may also be formed according to the process described above after the detachable film is peeled off. That is, a sequence is not necessarily limited to the abovementioned sequence.

Next, the remaining metal layer may be removed by the known etching method, or the like. In this case, a portion of the first redistribution layer 112a may be removed so that the first redistribution layer 112a is recessed in an inward direction of the insulating layer 111. In addition, the through-hole 110H may be formed in the insulating layer 111. The through-hole 110H may be formed using mechanical drilling or laser drilling. However, the through-hole 110H is not limited to being formed using the mechanical drilling or the laser drilling, and may also be formed by a sandblasting method using particles for polishing, a dry etching method using plasma, or the like. In a case in which the through-hole 110H is formed using the mechanical drilling or the laser drilling, a resin smear in the through-hole 110H may be removed by performing a desmearing process such as a permanganate method, or the like. Next, an adhesive film may be attached to one surface of the insulating layer 111. Any material that may fix the insulating layer 111 may be used as the adhesive film. As a non-restrictive example of this material, the known tape, or the like, may be used. An example of the known tape may include a thermosetting adhesive tape of which adhesion is weakened by heat treatment, an ultraviolet-curable adhesive tape of which adhesion is weakened by ultraviolet light irradiation, or the like. Next, the semiconductor chip 120 may be disposed in the through-hole 110H. For example, the semiconductor chip 120 may be disposed by a method of attaching the semiconductor chip 120 onto the adhesive film in the through-hole 110H. The semiconductor chip 120 may be disposed in a face-down form so that the connection pads 122 are attached to the adhesive film. The semiconductor chip 120 may be attached to the adhesive film so that the connection pads 122 are partially recessed in an inward direction of the semiconductor chip 120 after the semiconductor chip 120 is attached to the adhesive film.

Next, at least portions of the first interconnection member 110 and the semiconductor chip 120 may be encapsulated using the encapsulant 130. The encapsulant 130 may cover the first interconnection member 110 and the inactive surface of the semiconductor chip 120, and may fill a space within the through-hole 110H. The encapsulant 130 may be formed by a known method. For example, the encapsulant 130 may be formed by a method of laminating a resin for forming the encapsulant 130 in a non-hardened state and then hardening the resin. Alternatively, the encapsulant 130 may be formed by a method of applying a resin for forming the encapsulant 130 in a non-hardened state on the adhesive film to encapsulate the first interconnection member and the semiconductor chip 120 and then hardening the resin. The semiconductor chip 120 may be fixed by the hardening. As the method of laminating the resin, for example, a method of performing a hot press process of pressing the resin for a predetermined time at a high temperature, decompressing the resin, and then cooling the resin to room temperature, cooling the resin in a cold press process, and then removing a work tool, or the like, may be used. As the method of applying the resin, for example, a screen printing method of applying ink with a squeegee, a spray printing method of applying ink in a mist form, or the like, may be used. The openings 131 may be formed in the encapsulant 130, if necessary. The openings 131 may be formed through mechanical drilling, laser drilling, or the like. Next, the adhesive film may be peeled off. A method of peeling off the adhesive film is not particularly limited, but may be a known method. For example, in a case in which the thermosetting adhesive tape of which adhesion is weakened by heat treatment, the ultraviolet-curable adhesive tape of which adhesion is weakened by ultraviolet light irradiation, or the like, is used as the adhesive film, the adhesive film may be peeled off after the adhesion of the adhesive film is weakened by heat-treating the adhesive film or may be peeled off after the adhesion of the adhesive film is weakened by irradiating the adhesive film with an ultraviolet light. Next, the second interconnection member 140 may be formed on the first interconnection member 110 and the active surface of the semiconductor chip 120 from which the adhesive film is removed. The second interconnection member 140 may be formed by sequentially forming the insulating layers 141 and then forming the redistribution layers 142 and the vias 143 on and in the insulating layers 141, respectively, by the plating process as described above, or the like. In addition, the passivation layer 150 may be formed on the second interconnection member 140. The passivation layer 150 may also be formed by a method of laminating a precursor of the passivation layer 150 and then hardening the precursor, a method of applying a material for forming the passivation layer 150 and then hardening the material, or the like.

Next, the openings formed of the plurality of holes exposing at least portions of the redistribution 142 may be formed in the passivation layer 150. The plurality of holes may be formed through mechanical drilling, laser drilling, or the like. Alternatively, the holes may also be formed by a photolithography method depending on a material of the passivation layer 150. Next, the plurality of holes may be filled with the conductive material so as to be connected to the exposed redistribution layer 142 to form the plurality of vias 161a, 161b, 161c, and 161d. In addition, the external connection pads 162 connected to the plurality of vias 161a, 161b, 161c, and 161d and extended onto the surface of the passivation layer 150 may be formed. Resultantly, the under-bump metal layer 160 may be formed. The under-bump metal layer 160 may be formed by sequentially forming the first conductor layer 160a and the second conductor layer 160b, in terms of materials. The first conductor layer 160a may be formed by the known plating process, for example, electroless plating such as sputtering, or the like. The second conductor layer 160b may be formed by a subtractive method, an additive method, a semi-additive method, a modified semi-additive method, or the like, using the known plating process such as electroplating. Next, the connection terminals 170 may be formed on the under-bump metal layer 160 by a known method. A method of forming the connection terminals 170 is not particularly limited. That is, the connection terminals 170 may be formed by the method well-known in the related art depending on a structure or a form thereof. The connection terminals 170 may be fixed by reflow, and portions of the connection terminals 170 may be embedded in the passivation layer 150 in order to enhance fixing force, and the remaining portions of the connection terminals 170 may be externally exposed, whereby reliability may be improved. Meanwhile, a series of processes may be processes of preparing the detachable film having a large size, manufacturing a plurality of fan-out semiconductor packages 100A through the abovementioned process, and then singulating the plurality of fan-out semiconductor packages into individual fan-out semiconductor packages 100A through a cutting process in order to facilitate mass production.

Figure 12A:
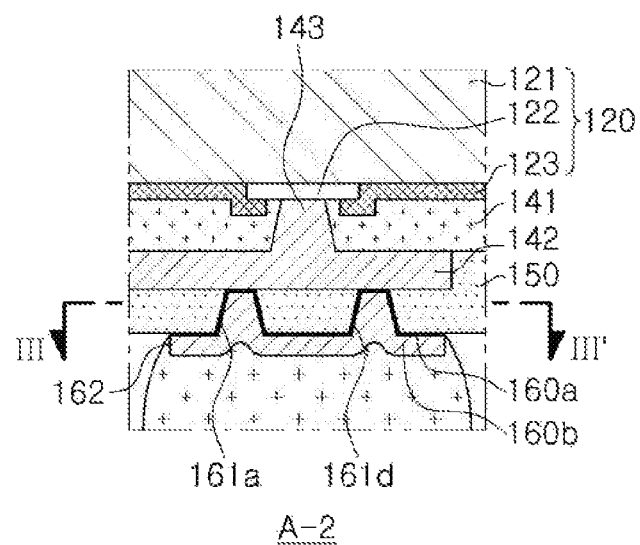
FIGS. 12A and 12B are schematic enlarged views illustrating a modified example of region A of the fan-out semiconductor package of FIG. 9.
Figure 12B:
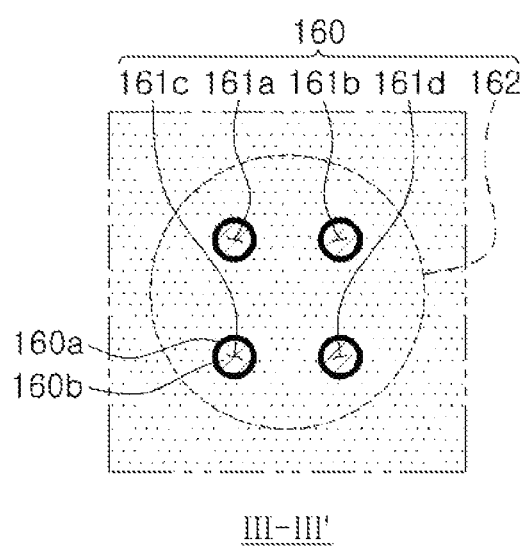

FIGS. 12A and 12B are schematic enlarged views illustrating a modified example of region A of the fan-out semiconductor package of FIG. 9.

Referring to the drawings, a plurality of dimples corresponding to a plurality of vias 161a, 161b, 161c, and 161d, respectively, may be formed on a surface of an external connection pad 162. That is, the surface of the external connection pad 162 may be non-linear. In a case in which the plurality of dimples are formed on the surface of the external connection pad 162 of an under-bump metal layer 160 in contact with a connection terminal 170, a contact interface between the under-bump metal layer 160 and the connection terminal 170 may be extended to disperse stress. In addition, adhesion between the under-bump metal layer 160 and the connection terminal 170 may be improved due to the extension of the contact interface. Resultantly, reliability may be further improved. Other descriptions overlap those described above, and are thus omitted.

Figure 13A:
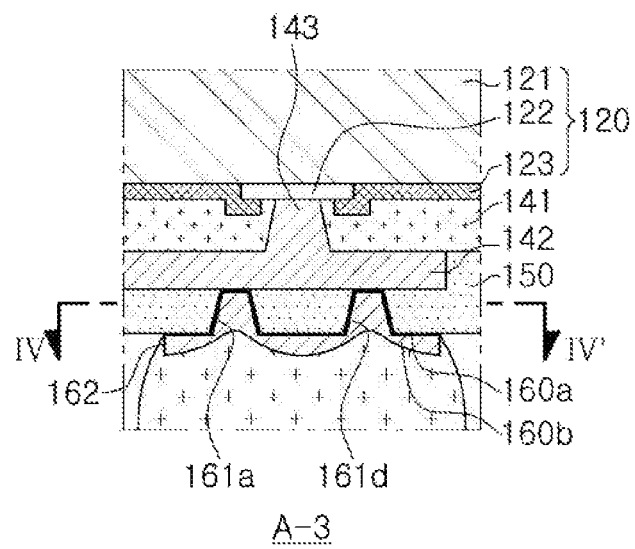
FIGS. 13A and 13B are schematic enlarged views illustrating another modified example of region A of the fan-out semiconductor package of FIG. 9.
Figure 13B:
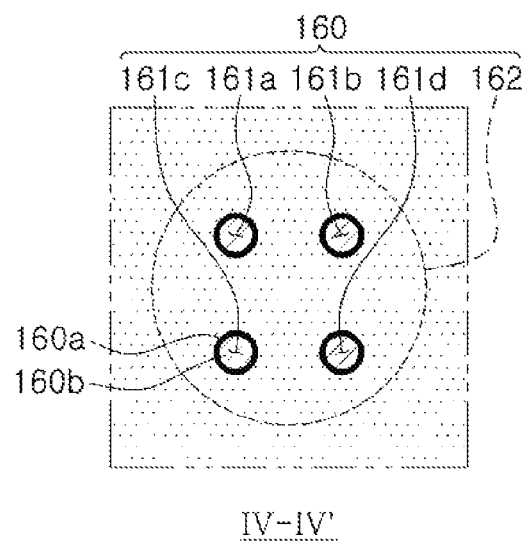

FIGS. 13A and 13B are schematic enlarged views illustrating another modified example of region A of the fan-out semiconductor package of FIG. 9.

Referring to the drawings, a plurality of dimples corresponding to the plurality of vias 161a, 161b, 161c, and 161d may be formed on a surface of an external connection pad 162 to arrive at inner portions of the plurality of vias 161a, 161b, 161c, and 161d. The plurality of dimples may be disposed in locations on the surface of the external connection pad 162 corresponding to the locations of the plurality of vias 161a, 161b, 161c, and 161d. Resultantly, reliability may be further improved. Other descriptions overlap those described above, and are thus omitted.

Figure 14A:
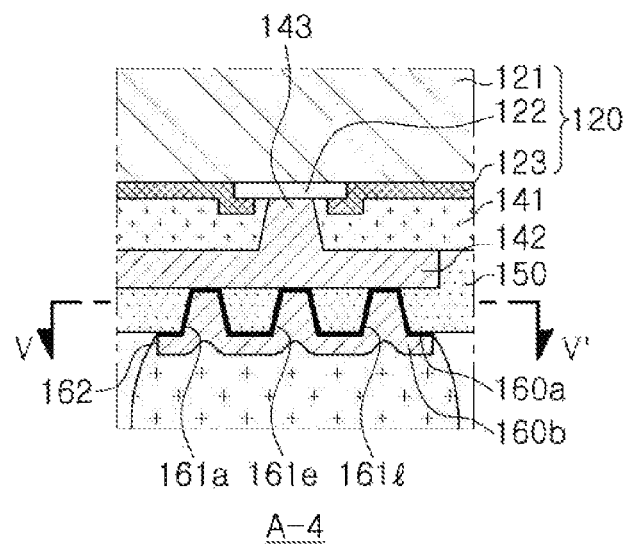
FIGS. 14A and 14B are schematic enlarged views illustrating another modified example of region A of the fan-out semiconductor package of FIG. 9.
Figure 14B:
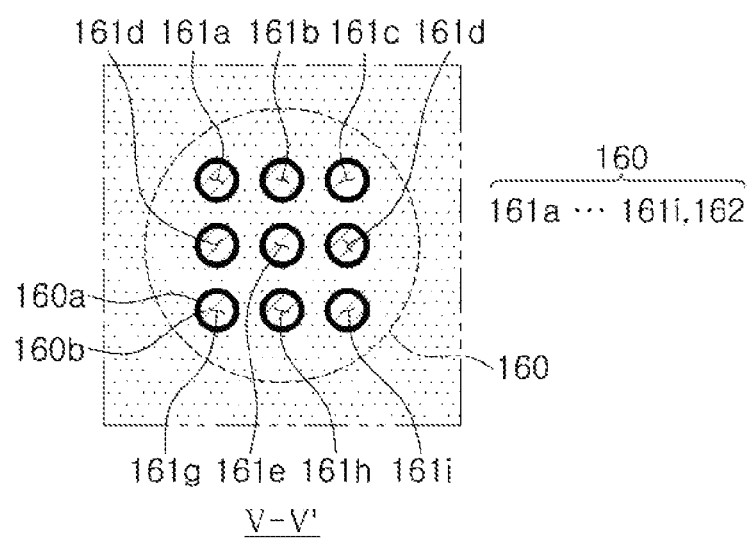

FIGS. 14A and 14B are schematic enlarged views illustrating another modified example of region A of the fan-out semiconductor package of FIG. 9.

Referring to the drawings, an under-bump metal layer 160 may include a larger number of vias 161a, 161b, 161c, 161d, 161e, 161f, 161g, 161h, and 161i. A vertical cross section of each of the vias 161a, 161b, 161c, 161d, 161e, 161f, 161g, 161h, and 161i may have a tapered shape, but is not limited thereto. A horizontal cross section of each of the vias 161a, 161b, 161c, 161d, 161e, 161f, 161g, 161h, and 161i may have a circular shape, but is not limited thereto. A larger number of dimples corresponding to the plurality of vias 161a, 161b, 161c, 161d, 161e, 161f, 161g, 161h, and 161i, respectively, may be formed on a surface of an external connection pad 162. When the under-bump metal layer 160 includes the larger number of vias and the larger number of dimples as described above, reliability may be further improved. Other descriptions overlap those described above, and are thus omitted.

Figure 15:
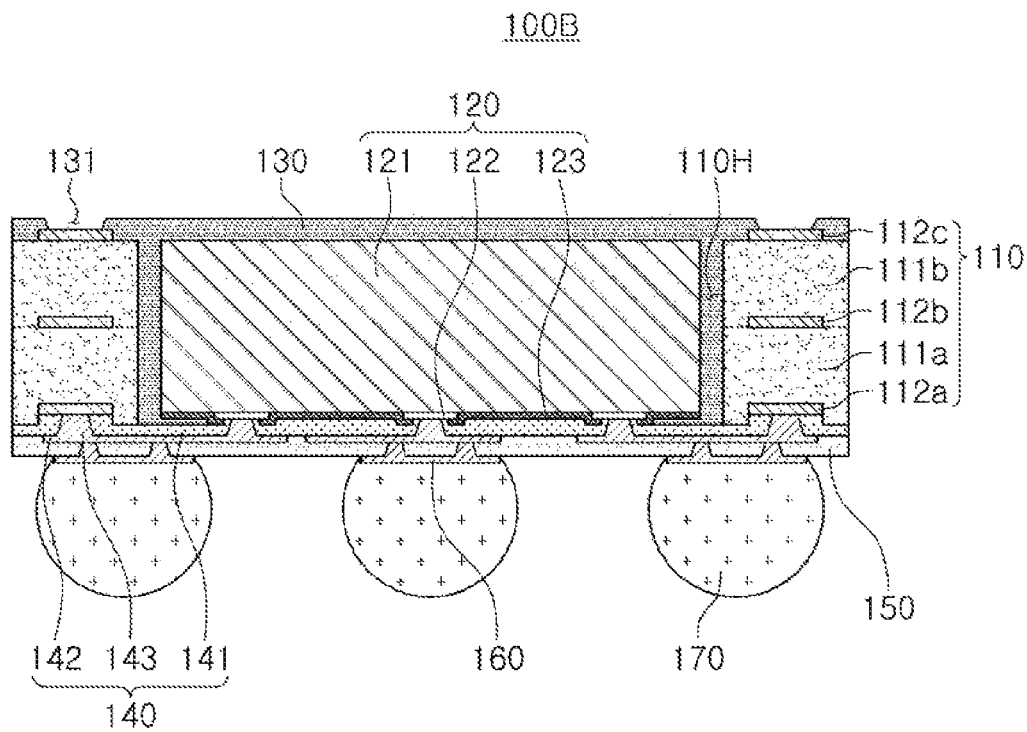
FIG. 15 is a schematic cross-sectional view illustrating another example of a fan-out semiconductor package.

FIG. 15 is a schematic cross-sectional view illustrating another example of a fan-out semiconductor package.

Referring to the drawing, in a fan-out semiconductor package 100B according to another exemplary embodiment in the present disclosure, a first interconnection member 110 may include a first insulating layer 111a in contact with a second interconnection member 140, a first redistribution layer 112a in contact with the second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. Meanwhile, although not illustrated in the drawing, the first and second redistribution layers 112a and 112b and the second and third redistribution layers 112b and 112c may be electrically connected to each other through first and second vias penetrating through the first and second insulating layers 111a and 111b, respectively.

Since the first redistribution layer 112a is embedded, an insulating distance of an insulating layer 141 of the second interconnection member 140 may be substantially constant, as described above. Since the first interconnection member 110 may include a large number of redistribution layers 112a, 112b, and 112c, the second interconnection member 140 may be further simplified. Therefore, a decrease in a yield depending on a defect occurring in a process of forming the second interconnection member 140 may be improved. The first redistribution layer 112a may be recessed into the first insulating layer 111a, such that a lower surface of the first insulating layer 111a and a lower surface of the first redistribution layer 112a have a step therebetween. Resultantly, when an encapsulant 130 is formed, a phenomenon in which a material of the encapsulant 130 bleeds to pollute the first redistribution layer 112a may be prevented.

The lower surface of the first redistribution layer 112a of the first interconnection member 110 may be disposed on a level above a lower surface of the connection pads 122 of the semiconductor chip 120. In addition, a distance between a redistribution layer 142 of the second interconnection member 140 and the first redistribution layer 112a of the first interconnection member 110 may be greater than that between the redistribution layer 142 of the second interconnection member 140 and the connection pads 122 of the semiconductor chip 120. The reason is that the first redistribution layer 112a may be recessed into the insulating layer 111. The second redistribution layer 112b of the first interconnection member 110 may be disposed on a level between an active surface and an inactive surface of the semiconductor chip 120. The first interconnection member 110 may be formed at a thickness corresponding to that of the semiconductor chip 120. Therefore, the second redistribution layer 112b formed in the first interconnection member 110 may be disposed on a level between the active surface and the inactive surface of the semiconductor chip 120.

Thicknesses of the redistribution layers 112a, 112b, and 112c of the first interconnection member 110 may be greater than those of the redistribution layers 142 of the second interconnection member 140. Since the first interconnection member 110 may have a thickness equal to or greater than that of the semiconductor chip 120, the redistribution layers 112a, 112b, and 112c may be formed to have large sizes depending on a scale of the first interconnection member 110. On the other hand, the redistribution layers 142 of the second interconnection member 140 may be formed at a relatively small size for thinness.

A description, or the like, of other configurations and a manufacturing method except for the abovementioned configuration overlaps that described above, and is thus omitted.

Figure 16:
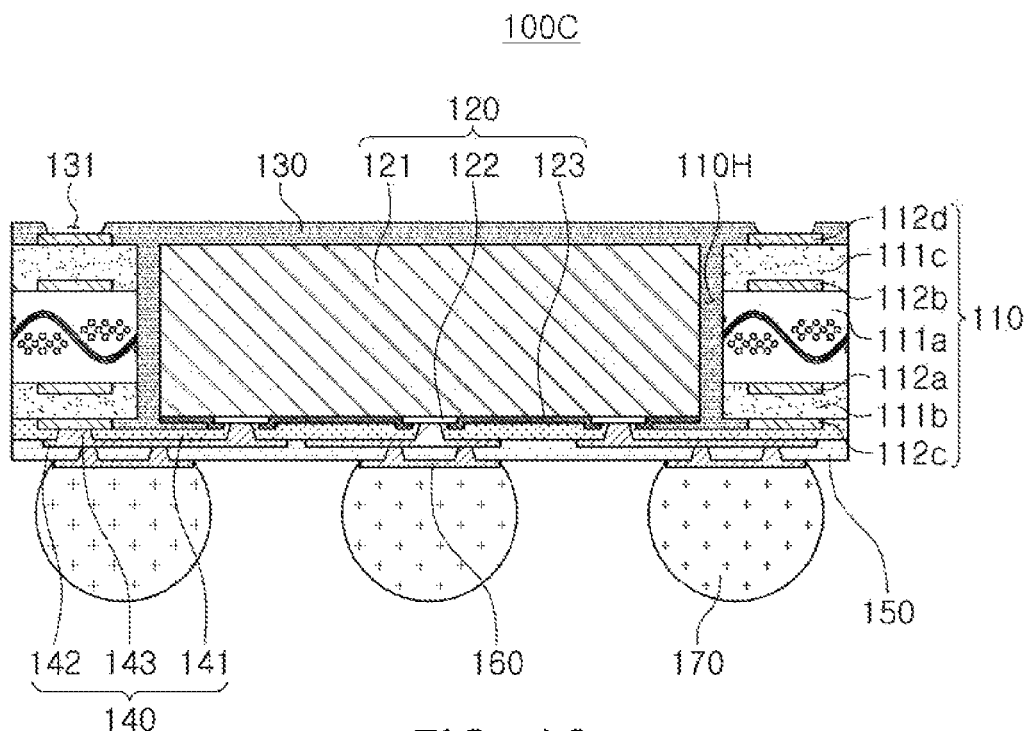
FIG. 16 is a schematic cross-sectional view illustrating another example of a fan-out semiconductor package.

FIG. 16 is a schematic cross-sectional view illustrating another example of a fan-out semiconductor package.

Referring to the drawing, in a fan-out semiconductor package 100C according to another exemplary embodiment in the present disclosure, a first interconnection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the first interconnection member 110 may include a larger number of redistribution layers 112a, 112b, 112c, and 112d, the second interconnection member 140 may be further simplified. Therefore, a decrease in a yield depending on a defect occurring in a process of forming the second interconnection member 140 may be improved. Meanwhile, although not illustrated in the drawing, the first to fourth redistribution layers 112a, 112b, 112c, and 112d may be electrically connected to each other through first to third vias penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first interconnection member 110 may be disposed on a level below a lower surface of the connection pads 122 of the semiconductor chip 120. In addition, a distance between a redistribution layer 142 of the second interconnection member 140 and the third redistribution layer 112c of the first interconnection member 110 may be smaller than that between the redistribution layer 142 of the second interconnection member 140 and the connection pads 122 of the semiconductor chip 120. The reason is that the third redistribution layer 112c may be disposed in a protruding form on the second insulating layer 111b, resulting in contact with the second interconnection member 140. The first redistribution layer 112a and the second redistribution layer 112b of the first interconnection member 110 may be disposed on a level between an active surface and an inactive surface of the semiconductor chip 120. The first interconnection member 110 may be formed at a thickness corresponding to that of the semiconductor chip 120. Therefore, the first redistribution layer 112a and the second redistribution layer 112b formed in the first interconnection member 110 may be disposed on a level between the active surface and the inactive surface of the semiconductor chip 120.

Thicknesses of the redistribution layers 112a, 112b, 112c, and 112d of the first interconnection member 110 may be greater than those of the redistribution layers 142 of the second interconnection member 140. Since the first interconnection member 110 may have a thickness equal to or greater than that of the semiconductor chip 120, the redistribution layers 112a, 112b, 112c, and 112d may also be formed to have large sizes. On the other hand, the redistribution layers 142 of the second interconnection member 140 may be formed at a relatively small size for thinness.

A description, or the like, of other configurations and a manufacturing method except for the abovementioned configuration overlaps that described above, and is thus omitted.

Figure 17:
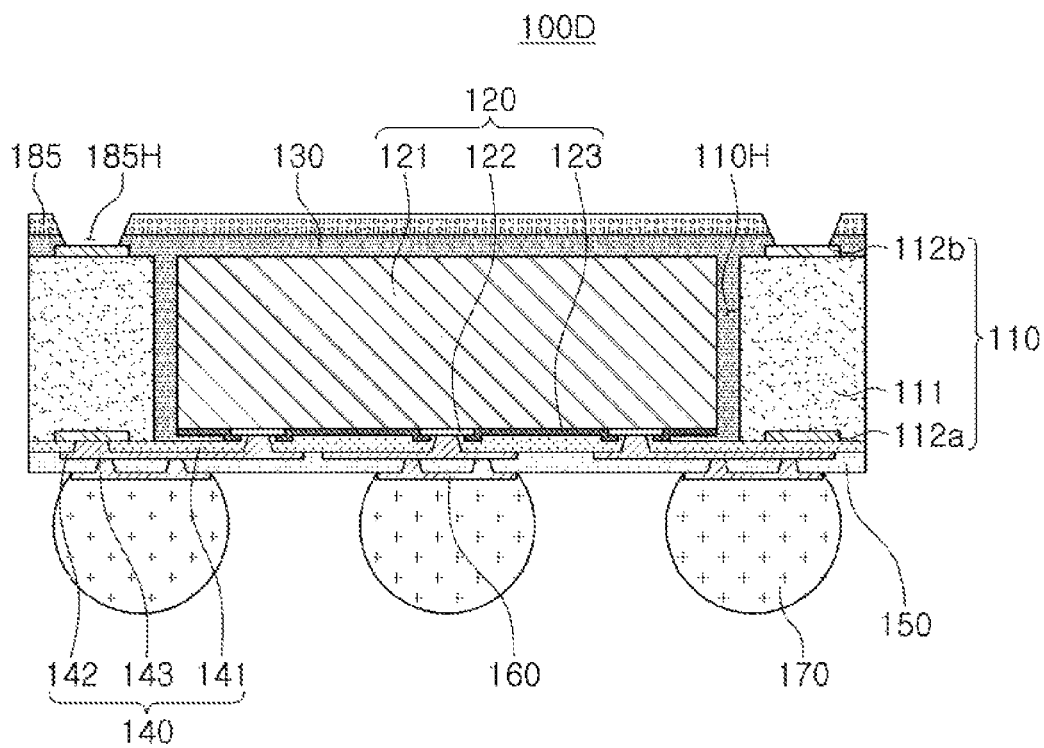
FIG. 17 is a schematic cross-sectional view illustrating another example of a fan-out semiconductor package.

FIG. 17 is a schematic cross-sectional view illustrating another example of a fan-out semiconductor package.

Referring to the drawing, a fan-out semiconductor package 100D according to another exemplary embodiment in the present disclosure may further include a reinforcing layer 185 disposed on an encapsulant 130. In this case, the reinforcing layer 185 may include a material that is the same as or similar to that of a passivation layer 150, such as an insulating resin in which an inorganic filler is impregnated. The reinforcing layer 185 may be, for example, ABF including an inorganic filler and an epoxy resin. A content of fillers in the reinforcing layer 185 may be greater than that of fillers in the encapsulant 130. Therefore, the reinforcing layer 185 may have a CTE lower than that of the encapsulant 130. In addition, a thickness of the reinforcing layer 185 may be greater than that of the encapsulant 130 in relation to an inactive surface of a semiconductor chip 120. Warpage of the fan-out semiconductor package 100D may be improved by introducing the reinforcing layer 185 described above. The reinforcing layer 185 may be attached to the encapsulant 130 in a hardened state, and a surface of the reinforcing layer 185 in contact with the encapsulant 130 may be thus flat. Openings 185H exposing at least portions of a redistribution layer 112b disposed on the other surface of a first interconnection member 110 may be formed in the reinforcing layer 185, and may be used as markings, or the like. In a case in which an insulating resin in which a filler is impregnated, such as ABF, or the like, is used as a material of the reinforcing layer 185, an insulating resin in which a filler is impregnated, such as ABF, or the like, may also be used as a material of the passivation layer 150. In this case, both of an upper portion and a lower portion of the fan-out semiconductor package may have excellent rigidity to thus more effectively improve warpage.

If necessary, the reinforcing layer 185 may be attached to the encapsulant 130 in a non-hardened state and then hardened. That is, ABF in a non-hardened state, or the like, may be used as a material of the reinforcing layer 185. In this case, a material of the reinforcing layer 185 having a small CTE may be permeated into a through-hole 110H due to mixture between heterogeneous materials in contact with each other or movement of a boundary surface. Therefore, regions of the encapsulant 130 filling spaces between a first interconnection member 110 and a semiconductor chip 120 may have dimples filled with the reinforcing layer 185. Close adhesion between the reinforcing layer 185 and the encapsulant 130 may be further improved. That is, a surface of the reinforcing layer 185 in contact with the encapsulant 130 may not be flat.

A description, or the like, of other configurations and a manufacturing method except for the abovementioned configuration overlaps that described above, and is thus omitted.

Figure 18:
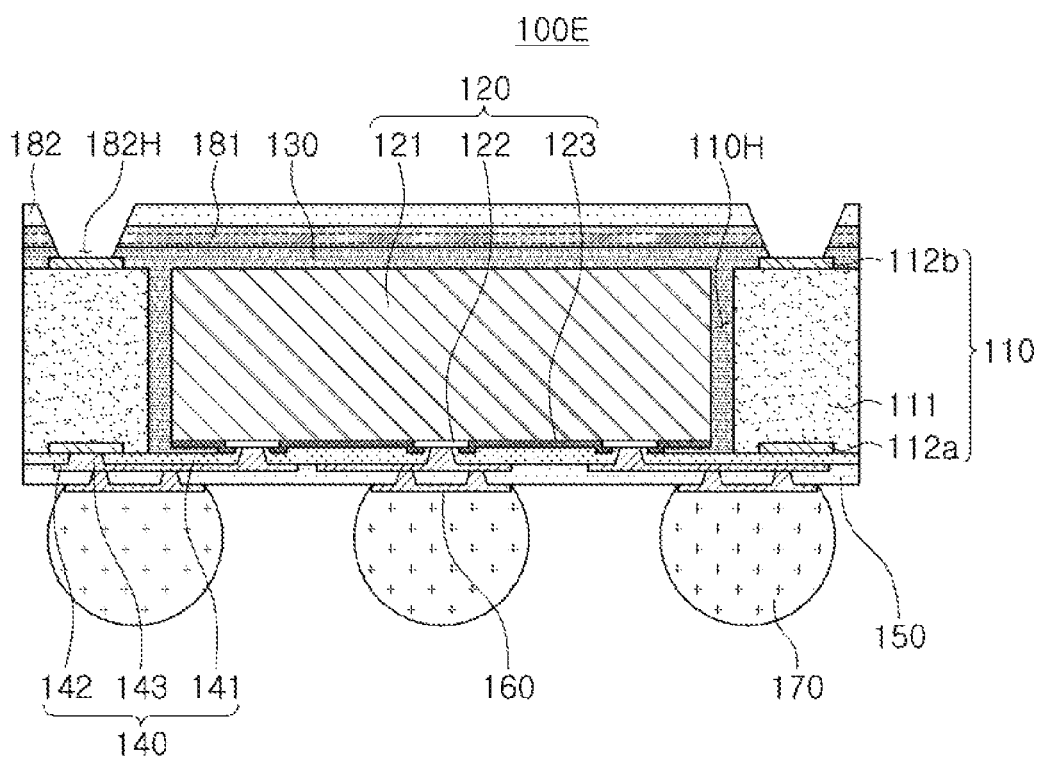
FIG. 18 is a schematic cross-sectional view illustrating another example of a fan-out semiconductor package.

FIG. 18 is a schematic cross-sectional view illustrating another example of a fan-out semiconductor package.

Referring to the drawing, a fan-out semiconductor package 100E according to another exemplary embodiment in the present disclosure may further include a reinforcing layer 181 disposed on an encapsulant 130. In this case, the reinforcing layer 181 may include a core material, an inorganic filler, and an insulating resin. The reinforcing layer 181 may be, for example, an unclad copper clad laminate (CCL). The unclad CCL that is not hardening-shrunk may hold the fan-out semiconductor package 100E at the time of hardening-shrinking the encapsulant 130. In this case, the reinforcing layer 181 may include the core material to thus have a relatively large elastic modulus. That is, the reinforcing layer 181 may have a modulus of elasticity greater than that of the encapsulant 130. That is, warpage of the fan-out semiconductor package 100E occurring at the time of being hardening-shrunk may be improved. The reinforcing layer 181 may be attached to the encapsulant 130 in a hardened state, and a surface of the reinforcing layer 181 in contact with the encapsulant 130 may be thus flat.

The fan-out semiconductor package 100E according to another exemplary embodiment may further include an insulating resin layer 182 disposed on the reinforcing layer 181, if necessary. The insulating resin layer 182 may be formed of an insulating resin having a physical property that is the same as or similar to that of the encapsulant 130. For example, the insulating resin layer 182 may be formed of an insulating resin in which an inorganic filler is impregnated, such as ABF having a physical property that is the same as or similar to that of the encapsulant 130. The insulating resin layer 182 may be disposed in order to facilitate formation of openings 182H. When the reinforcing layer 181 is formed as an outermost portion, it may be difficult to form the openings 182H. However, when the insulating resin layer 182 is disposed on the reinforcing layer 181, it may be easy to form the openings 182H. The openings 182H may be used as markings, or the like. In addition, when the insulating resin layer 182 is further disposed, warpage may be more effectively improved. The insulating resin layer 182 may be attached to the reinforcing layer 181 in a hardened state, and a surface of the insulating resin layer 182 in contact with the reinforcing layer 181 may be thus flat.

If necessary, the reinforcing layer 181 may be attached to the encapsulant 130 in a non-hardened state and be then hardened. That is, prepreg in a non-hardened state, or the like, may be used as a material of the reinforcing layer 181.

In this case, a material of the reinforcing layer 181 having a small CTE may be permeated into a through-hole 110H due to mixture between heterogeneous materials in contact with each other or movement of a boundary surface. That is, regions of the encapsulant 130 filling spaces between a first interconnection member 110 and a semiconductor chip 120 may have dimples (not illustrated) filled with the reinforcing layer 181. In this case, close adhesion between the reinforcing layer 181 and the encapsulant 130 may be further improved. That is, a surface of the reinforcing layer 181 in contact with the encapsulant 130 may not be flat. In some case, an asymmetrical material of which amounts of filler are different from each other in relation to a glass cloth may also as used as the material of the reinforcing layer 181. That is, asymmetrical prepreg in a non-hardened state may also be used as the material of the reinforcing layer 181. In this case, contents of the filler may be greater in a sequence of the encapsulant 130, a portion of the reinforcing layer 181 adjacent to the encapsulant 130, and an opposite portion of the reinforcing layer 181 to the portion of the reinforcing layer 181 adjacent to the encapsulant 130.

A description, or the like, of other configurations and a manufacturing method except for the abovementioned configuration overlaps that described above, and is thus omitted.

As set forth above, according to exemplary embodiments in the present disclosure, a fan-out semiconductor package capable of having sufficient reliability against stress transferred through a connection terminal may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a semiconductor chip having an active surface having connection pads and a first passivation layer directly disposed thereon and an inactive surface opposing the active surface, the first passivation layer exposing a portion of the connection pads;
   an encapsulant encapsulating at least portions of the inactive surface of the semiconductor chip;
   an interconnection member disposed on the active surface of the semiconductor chip and including a redistribution layer electrically connected to the connection pads of the semiconductor chip and a first insulating layer;
   a second passivation layer disposed on the interconnection member opposite to the active surface of the semiconductor chip;
   an under-bump metal layer including a connection pad formed on the second passivation layer, and vias penetrating the second passivation layer and connecting the connection pad of the under-bump metal layer and a pattern of the redistribution layer of the interconnection member to each other; and
   a connection terminal disposed on the connection pad of the under-bump metal layer and connected to the vias through the connection pad of the under-bump metal layer,
   wherein the connection pad of the under-bump metal layer includes a plurality of dimples corresponding to the vias,
   each of the vias has a substantially circular shape in a plane cutting the vias, and
   the connection pad is connected to the pattern of the redistribution layer through only the vias having a constant distance between any two immediately adjacent vias thereof in a first direction and having a constant distance between any two immediately adjacent vias thereof in a second direction perpendicular to the first direction.

2. The semiconductor package of claim 1, further comprising an insulating member having a through-hole,
   wherein the semiconductor chip is disposed in the through-hole of the insulating member.

3. The semiconductor package of claim 2, wherein the insulating member includes a second insulating layer,
   a first redistribution layer is disposed on a first surface of the second insulating layer,
   a second redistribution layer is disposed on a second surface of the second insulating layer opposing the first surface of the second insulating layer, and
   the first and second redistribution layers are electrically connected to the connection pads of the semiconductor chip.

4. The semiconductor package of claim 1, wherein a surface of the connection pad of the under-bump metal layer between adjacent dimples is a curved surface.

5. The semiconductor package of claim 1, wherein the second passivation layer has an upper surface facing the interconnection member and a lower surface opposing the upper surface of the second passivation layer, and
   the plurality of dimples are recessed toward the interconnection member and are spaced apart from a level of the lower surface of the second passivation layer.

6. The semiconductor package of claim 1, wherein in a cross section taken along a stacking direction along which the semiconductor chip and the interconnection member are stacked, each of the plurality of dimples corresponds to a portion of a round shape.

7. The semiconductor package of claim 1, wherein a thickness of a portion of the connection pad without the plurality of dimples is greater than a depth of each of the plurality of dimples formed therein.

\* \* \* \* \*